United States Patent
Sode (10) Patent No.: US 8,375,346 B2
(45) Date of Patent: Feb. 12, 2013

(54) METHOD AND APPARATUS FOR LAYING OUT POWER WIRING OF SEMICONDUCTOR

(75) Inventor: Mikiko Sode, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 61 days.

(21) Appl. No.: 13/070,500

(22) Filed: Mar. 24, 2011

(65) Prior Publication Data

US 2011/0239180 A1    Sep. 29, 2011

(30) Foreign Application Priority Data

Mar. 26, 2010    (JP) .................................. 2010-071790

(51) Int. Cl.
G06F 17/50    (2006.01)
(52) U.S. Cl. .................... 716/120; 716/119; 716/127
(58) Field of Classification Search .................. 716/119, 716/120, 127
See application file for complete search history.

(56) References Cited

U.S. PATENT DOCUMENTS

| 5,404,310 | A | 4/1995 | Mitsuhashi | |
|---|---|---|---|---|
| 6,405,346 | B1 | 6/2002 | Nawa | |
| 6,946,824 | B2 * | 9/2005 | Waizman et al. | 323/285 |
| 7,210,108 | B2 * | 4/2007 | Uda | 257/207 |
| 7,346,869 | B2 * | 3/2008 | Tai et al. | 716/120 |
| 7,353,490 | B2 * | 4/2008 | Jiang et al. | 716/109 |
| 7,603,641 | B2 * | 10/2009 | Lin | 716/120 |

FOREIGN PATENT DOCUMENTS

| JP | 03-204958 | 9/1991 |
|---|---|---|
| JP | 2000-349161 | 12/2000 |

OTHER PUBLICATIONS

Jaskirat Singh et al.—Partition-Based Algorithm for Power Grid Design Using Locality—IEEE Transactions on Computer-Aided Design of Integrated Circuit and Systems, vol. 25, No. 4, Apr. 2006—pp. 664-677.

Takashi Mitsuhashi et al.—Power Ground Network Topology Optimization for Cell Based VLSIs—1992—pp. 1-6.

* cited by examiner

*Primary Examiner* — Stacy Whitemore
*Assistant Examiner* — Magid Dimyan
(74) *Attorney, Agent, or Firm* — Young & Thompson (57) ABSTRACT

An aspect of the present invention is a method for laying out a power wiring of a semiconductor device. The method includes: modeling the power wiring as an analysis model including a plurality of nodes and a plurality of element resistors provided between the plurality of nodes neighboring each other; obtaining voltage values of the plurality of nodes by a circuit simulation; searching a path of a current flowing into a node of the plurality of nodes when an IR drop violation exists in the voltage values, the node having a maximum value of the IR drop violation; selecting a bottleneck element resistor from among the plurality of element resistors included in the path; and changing a resistance value of the bottleneck element resistor.

8 Claims, 9 Drawing Sheets

METHOD AND APPARATUS FOR LAYING OUT POWER WIRING OF SEMICONDUCTOR

CROSS-REFERENCE TO RELATED APPLICATIONS

This application is based upon and claims the benefit of priority from Japanese patent application No. 2010-071790, filed on Mar. 26, 2010, the disclosure of which is incorporated herein in its entirety by reference.

BACKGROUND

The present invention relates to a method and an apparatus for laying out a power wiring of a semiconductor device.

Along with miniaturization and speeding-up (increasing operating frequency) of semiconductor integrated circuits, it becomes important to prevent voltage drops in a power wiring, or so-called IR drops, which cause a malfunction. The IR drop can be evaluated by modeling a power wiring layout and performing a DC (direct-current) analysis by using SPICE (Simulation Program with Integrated Circuit Emphasis) on a computer, for example.

Mitsuhashi et al. ("Power and Ground Network Topology Optimization for Cell Based VLSIs," Proceedings of the 29th Design Automation Conference, pp. 524-529, 1992.) and Japanese Unexamined Patent Application Publication No. 03-204958 disclose analysis methods for dealing with IR drops purely mathematically as a nonlinear function problem. However, it is difficult to apply these analysis methods to a practical method for laying out a power wiring because the solution may not converge.

In the practical method for laying out a power wiring, when an IR drop violation exists as a result of a DC analysis, the DC analysis is performed again after widening the power wiring, for example. A sequence of operations are repeated until the IR drop violation is resolved.

Singh et al. ("Partition-Based Algorithm for Power Grid Design Using Locality," IEEE Transactions on Computer-aided Design of Integrated Circuits and Systems, vol. 25, no. 4, pp. 664-677, April, 2006.) discloses a method for resolving the IR drop violation by widening the whole wiring in a certain region when the IR drop violation exists. Further, Japanese Unexamined Patent Application Publication No. 2000-349161 discloses a method for resolving the IR drop violation by providing an optimization target wiring and widening the whole optimization target wiring when the IR drop violation exists.

SUMMARY

The present inventor has found a problem shown below. The increase in width of the wiring to resolve the IR drop violation should be minimized because the area of the power wiring increases and semiconductor integrated circuits become larger. However, in the methods disclosed by Singh et al. and in Japanese Unexamined Patent Application Publication No. 2000-349161, semiconductor integrated circuits tend to become larger due to widening the whole wiring.

A first aspect of the present invention is a method for laying out a power wiring of a semiconductor device. The method includes: modeling the power wiring as an analysis model having a plurality of nodes and a plurality of element resistors provided between the plurality of nodes neighboring each other; obtaining voltage values of the plurality of nodes by a circuit simulation; searching a path of a current flowing to a node of the plurality of nodes when an IR drop violation exists in the voltage values, the node having maximum value of the IR drop violation; selecting a bottleneck element resistor from among the plurality of element resistors included in the path; and changing a resistance value of the bottleneck element resistor.

A second aspect of the present invention is an apparatus for laying out a power wiring of a semiconductor device. The apparatus includes: a power wiring modeling unit that models the power wiring as an analysis model having a plurality of nodes and a plurality of element resistors provided between the plurality of nodes neighboring each other; an IR drop determination unit that obtains voltage values of the plurality of nodes and determines whether an IR drop violation exists or not in the voltage values; and a bottleneck determination unit that searches a path of a current flowing to a node having a maximum value of the IR drop violation from the plurality of nodes, determines a bottleneck element resistor from the plurality of element resistors included in the path, and changes a resistance value of the bottleneck element resistor.

In the present invention, a path of a current flowing into a node having a maximum value of the IR drop violation is searched; a bottleneck element resistor is selected from the element resistors included in the path; and a resistance value of the bottleneck element resistor is changed. Therefore, the IR drop violation can be resolved and an increase in size of semiconductor integrated circuits can be prevented.

According to aspects of the present invention, it is possible to provide a method and an apparatus for laying out a power wiring of a semiconductor device capable of resolving the IR drop violation and preventing an increase in size of the semiconductor device.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments of the present invention will be described in detail below with reference to the accompanying drawings.

Note that the present invention is not limited to embodiments described below. The following description and the accompanying drawings are appropriately simplified to clarify the explanation.

First Embodiment

Figure 1:
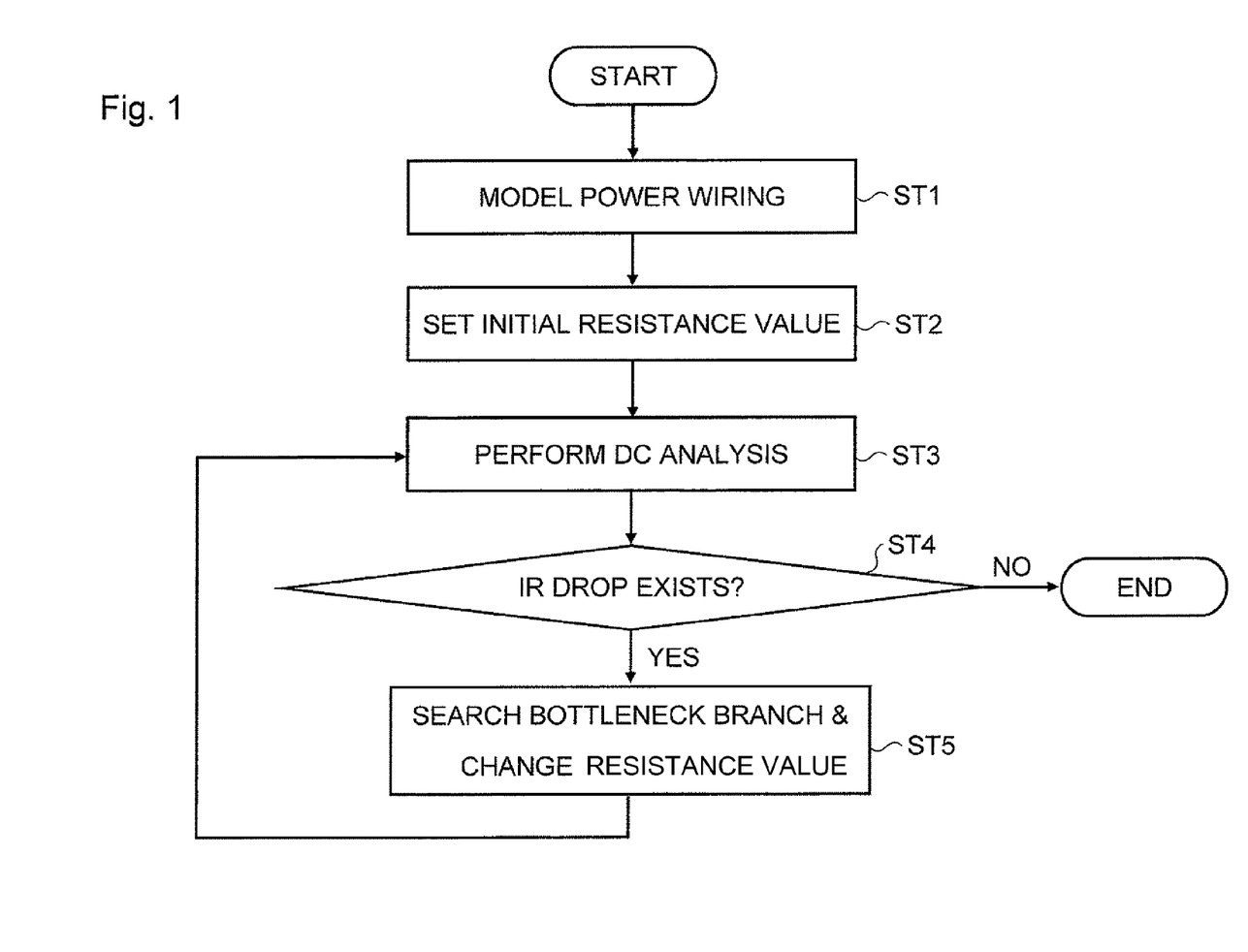
FIG. 1 is a flowchart showing a method for laying out a power wiring of a semiconductor device according to a first embodiment of the present invention.

A method for laying out a power wiring of a semiconductor device according to a first embodiment of the present invention is described hereinafter with reference to FIG. 1. FIG. 1 is a flowchart showing the method for laying out a power wiring of a semiconductor device according to the first embodiment of the present invention. As shown in FIG. 1, the method for laying out a power wiring has five steps: step ST1 of modeling a power wiring, step ST2 of setting an initial resistance value, step ST3 of performing a DC analysis, step ST4 of determining whether the IR drop violation exists or not, and step ST5 of searching a bottleneck branch and changing the resistance value of the bottleneck branch when the IR drop violation exists.

Figure 2A:
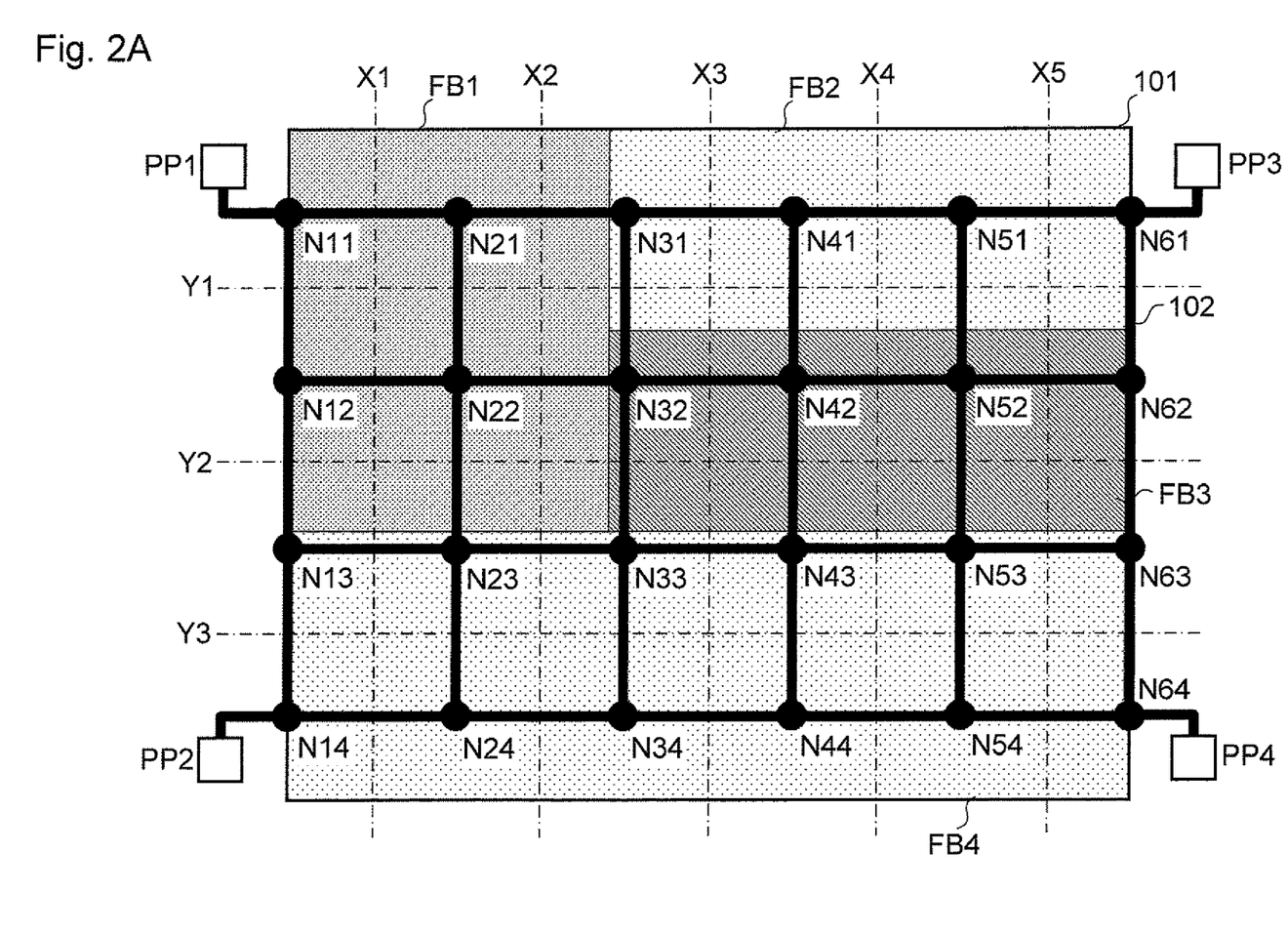
FIG. 2A is a plan view showing a power wiring network layout of a semiconductor device chip 101.

First, step ST1 of modeling a power wiring is described. FIG. 2A is a plan view showing a power wiring network layout of a semiconductor device chip 101 such as a system LSI (Large Scale Integration). A power wiring network to be modeled is described hereinafter with reference to FIG. 2A. As shown in FIG. 2A, the semiconductor device chip 101 has a power wiring network 102 indicated by a bold line.

The power wiring network 102 is a net-like wiring having four rows in the vertical direction of FIG. 2A and six columns in the horizontal direction of FIG. 2A. Thus, the power wiring network 102 has a total of 24 (=4×6) nodes at intersections of wirings in the horizontal direction and wirings in the vertical direction.

Specifically, in the leftmost column of the wiring of FIG. 2A, four nodes N11 to N14 align. In the column located on the immediate right of this column of the wiring, four nodes N21 to N24 align. In the column located on the immediate right of this column of the wiring, four nodes N31 to N34 align. In the column located on the immediate right of this column of the wiring, four nodes N41 to N44 align. In the column located on the immediate right of this column of the wiring, four nodes N51 to N54 align. Further, in the column located on the immediate right of this column of the wiring, or in the rightmost column of the wiring of FIG. 2A, four nodes N61 to N64 align.

In other words, in the uppermost row of the wiring of FIG. 2A, six nodes N11, N21, N31, N41, N51, and N61 align. In the row located immediate below this row of the wiring, six nodes N12, N22, N32, N42, N52, and N62 align. In the row located immediate below this row of the wiring, six nodes N13, N23, N33, N43, N53, and N63 align. Further, in the row located immediate below this row of the wiring, or in the lowermost row of the wiring of FIG. 2A, six nodes N14, N24, N34, N44, N54, and N64 align.

Among the 24 nodes, four nodes N11, N14, N61, and N64 located at four corners are connected to power pads PP1, PP2, PP3, and PP4 through wirings, respectively.

Next, a method of determining the amount of current flowing into each node in the method for laying out a power wiring of this embodiment is described. First, the whole semiconductor device chip 101 is segmented into 24 regions respectively corresponding to the 24 nodes. Then, the amount of consumption current in each segmented region is assumed as the amount of current flowing into each node. The determination method is described more specifically below. As shown in FIG. 2A, five vertical lines X1 to X5 and three horizontal lines Y1 to Y3 which are indicated by broken lines divide the whole semiconductor device chip 101 into 24 regions.

Here, as shown FIG. 2A, the semiconductor device chip 101 has four digital functional block regions FB1 to FB4. Hatching patterns in FIG. 2A are changed for each of the functional block regions FB1 to FB4. Here, the amount of consumption current in each of the functional block regions FB1 to FB4 is determined in design. Therefore, the amount of consumption current per unit area (which is called the unit amount of consumption current hereinafter) in each of the functional block regions FB1 to FB4 is obtained.

For example, the segmented region assigned to the node N11 (which is called a node N11 segmented region, for example, hereinafter) is a region surrounded by the boundary of the semiconductor device chip 101, the vertical line X1, and the horizontal line Y1. Thus, the amount of current flowing into the node N11 is a product of the unit amount of consumption current in the functional block region FB1 and the area of the node N11 segmented region. In a similar manner, the node N21 segmented region is a region surrounded by the boundary of the semiconductor device chip 101, the vertical lines X1 and X2, and the horizontal line Y1. Thus, the amount of current flowing into the node N21 is a product of the unit amount of consumption current in the digital functional block region FB1 and the area of the node N21 segmented region.

Further, the node N31 segmented region is a region surrounded by the boundary of the semiconductor device chip 101, the vertical lines X2 and X3, and the horizontal line Y1. This region includes two functional block regions FB1 and FB2. Thus, the amount of current flowing into the node N31 is a sum of two products (1) and (2). Here, the product (1) is a product of the unit amount of consumption current in the functional block region FB1 and the area of the functional block region FB1 in the node N31 segmented region. The product (2) is a product of the unit amount of consumption current in the functional block region FB2 and the area of the functional block region FB2 in the node N31 segmented region.

In addition, the node N32 segmented region is a region surrounded by the vertical lines X2 and X3 and the horizontal lines Y1 and Y2. This region includes three functional block regions FB1, FB2, and FB3. Thus, the amount of current flowing into the node N32 is a sum of three products (1), (2), and (3). Here, the product (1) is a product of the unit amount of consumption current in the functional block region FB1 and the area of the functional block region FB1 in the node N32 segmented region. The product (2) is a product of the unit amount of consumption current in the functional block region FB2 and the area of the functional block region FB2 in the node N32 segmented region. The product (3) is a product of the unit amount of consumption current in the functional block region FB3 and the area of the functional block region FB3 in the node N32 segmented region. The amount of current flowing into other nodes is obtained in a similar manner, so the description thereof is omitted.

Figure 2B:
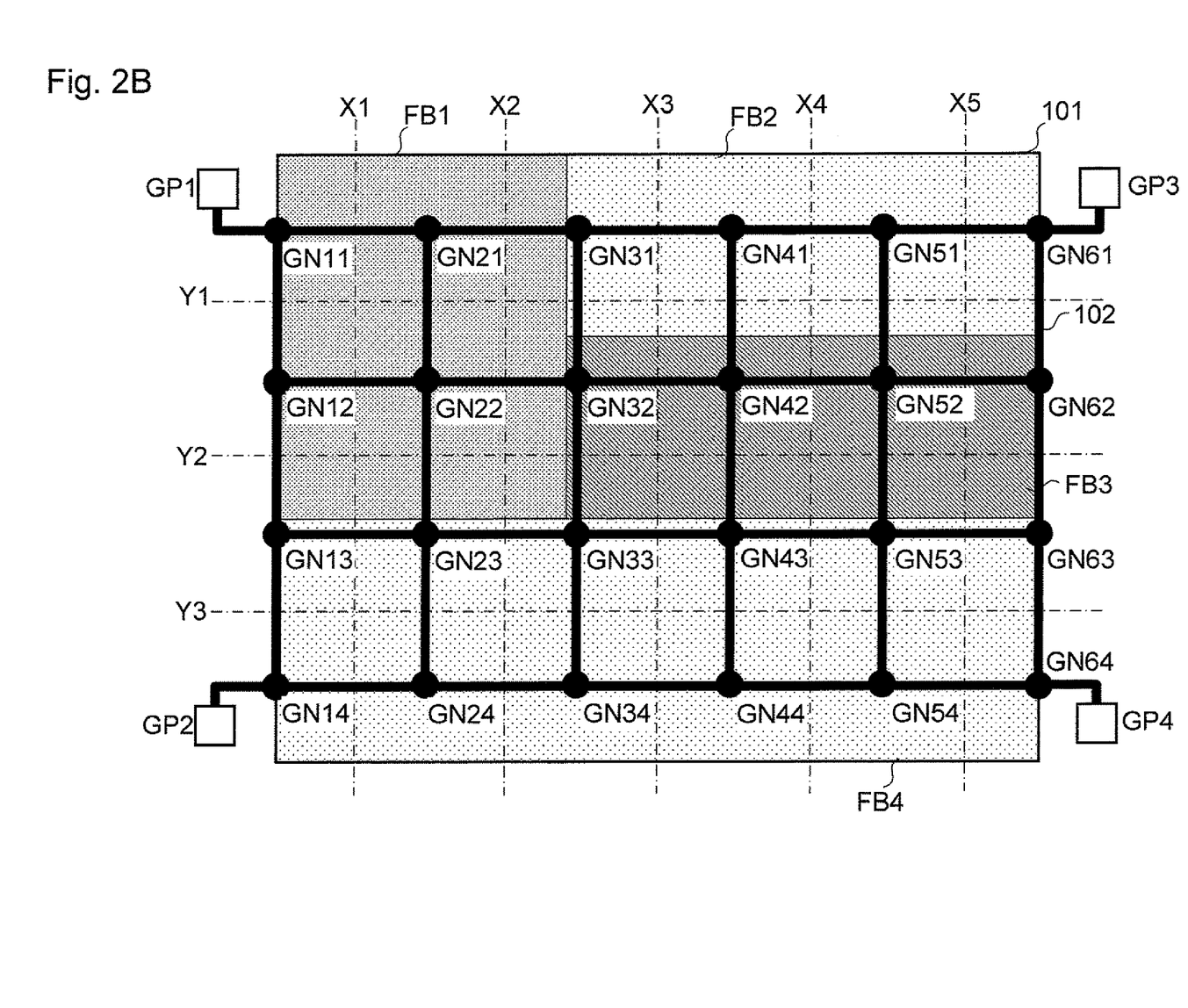
FIG. 2B is a plan view showing a ground wiring network layout of the semiconductor device chip 101.

FIG. 2B is a plan view showing a ground wiring network layout of the semiconductor device chip 101 and corresponding to the power wiring network layout shown in FIG. 2A. Twenty-four nodes (nodes GN11 to GN14, nodes GN21 to GN24, nodes GN31 to GN34, nodes GN41 to GN44, nodes GN51 to GN54, and nodes GN61 to GN64) corresponding to 24 nodes (nodes N11 to N14, nodes N21 to N24, nodes N31 to N34, nodes N41 to N44, nodes N51 to N54, and nodes N61 to N64) shown in FIG. 2A are arranged.

Among the 24 nodes, the nodes GN11, GN14, GN61, and GN64 at four corners are connected to ground pads GP1, GP2, GP3, and GP4 through wirings, respectively.

Here, a current flows from the node N11 of FIG. 2A to the corresponding node GN11 of FIG. 2B. In a similar way, a current flows from the node N12 of FIG. 2A to the corresponding node GN12 of FIG. 2B. Also in other nodes, a current flows in a similar manner, so the description thereof is omitted.

Figure 3:
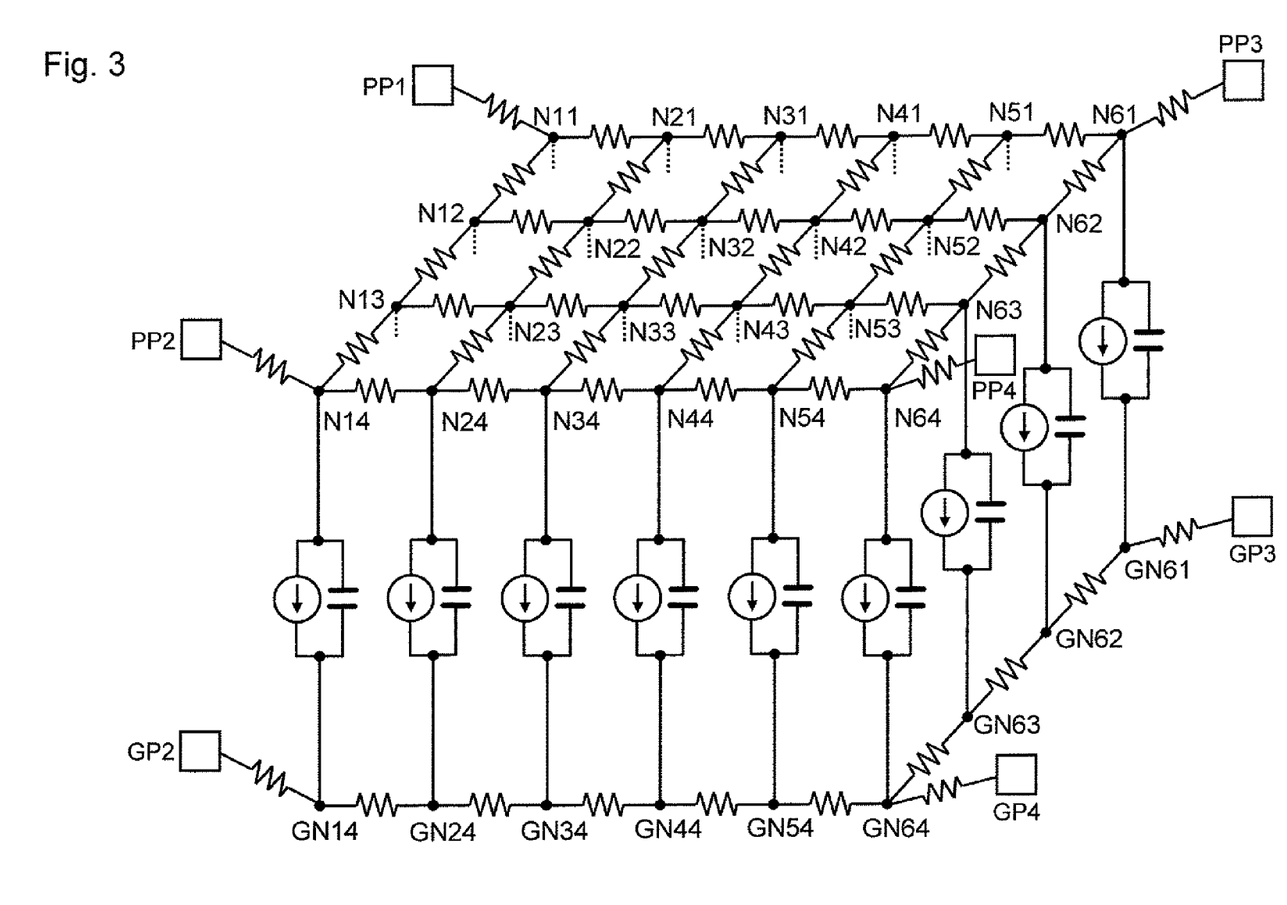
FIG. 3 is a perspective view showing an analysis model corresponding to the power wiring network of FIG. 2A and the ground wiring network of FIG. 2B.

FIG. 3 is a perspective view showing an analysis model corresponding to the power wiring network of FIG. 2A and the ground wiring network of FIG. 2B. As shown in FIG. 3, the analysis model has a cuboid shape. The upper surface corresponds to the analysis model of the power wiring network shown in FIG. 2A. The lower surface corresponds to the analysis model of the ground wiring network shown in FIG. 2B. As shown in FIG. 3, each wiring between neighboring nodes (which is called a branch hereinafter) in the power wiring network shown in FIG. 2A is modeled as an element resistor. In addition, each wiring between the power pads PP1 to PP4 and their nearest neighboring nodes N11, N14, N61, and N64 is also modeled as an element resistor. The ground wiring network shown in FIG. 2B is modeled in a similar manner. Note that the analysis model of the ground wiring network is partially omitted, as is obvious from FIG. 3.

In the analysis model shown in FIG. 3, 24 nodes of the power wiring network shown in FIG. 2A are connected to the respective 24 nodes of the ground wiring network shown in FIG. 2B through current sources. Specifically, as shown in FIG. 3, the node N14 of the power wiring is connected to the corresponding node GN14 of the ground wiring through a current source. In a similar manner, the node N24 of the power wiring is connected to the corresponding node GN24 of the ground wiring through a current source. Other nodes are connected in a similar manner, so the description thereof is omitted. Here, as shown in FIG. 3, each current source is connected in parallel to a decoupling capacitor. However, the decoupling capacitors have no influence on the DC analysis.

Next, step ST2 in FIG. 1 of setting the initial resistance value is described. Although the initial resistance value is not limited in particular, it is preferred to set a large value as the initial resistance value. Here, a resistance value can be changed depending on a wiring width, the number of wirings, a wiring thickness, or the like. However, it is preferred to change the wiring width in order to change the resistance value with less effect on the manufacturing process. In this case, the narrower width of the wiring indicates the larger resistance of the wiring. Thus, the finally obtained area of the power wiring can be reduced by starting from the wiring having a width as small as possible.

Next, step ST3 in FIG. 1 of performing the DC analysis is described. The DC analysis can be performed by using SPICE (Simulation Program with Integrated Circuit Emphasis) on a computer, for example. By the DC analysis, the voltage of each node of the power wiring network shown in FIG. 2A can be obtained.

Figure 4:
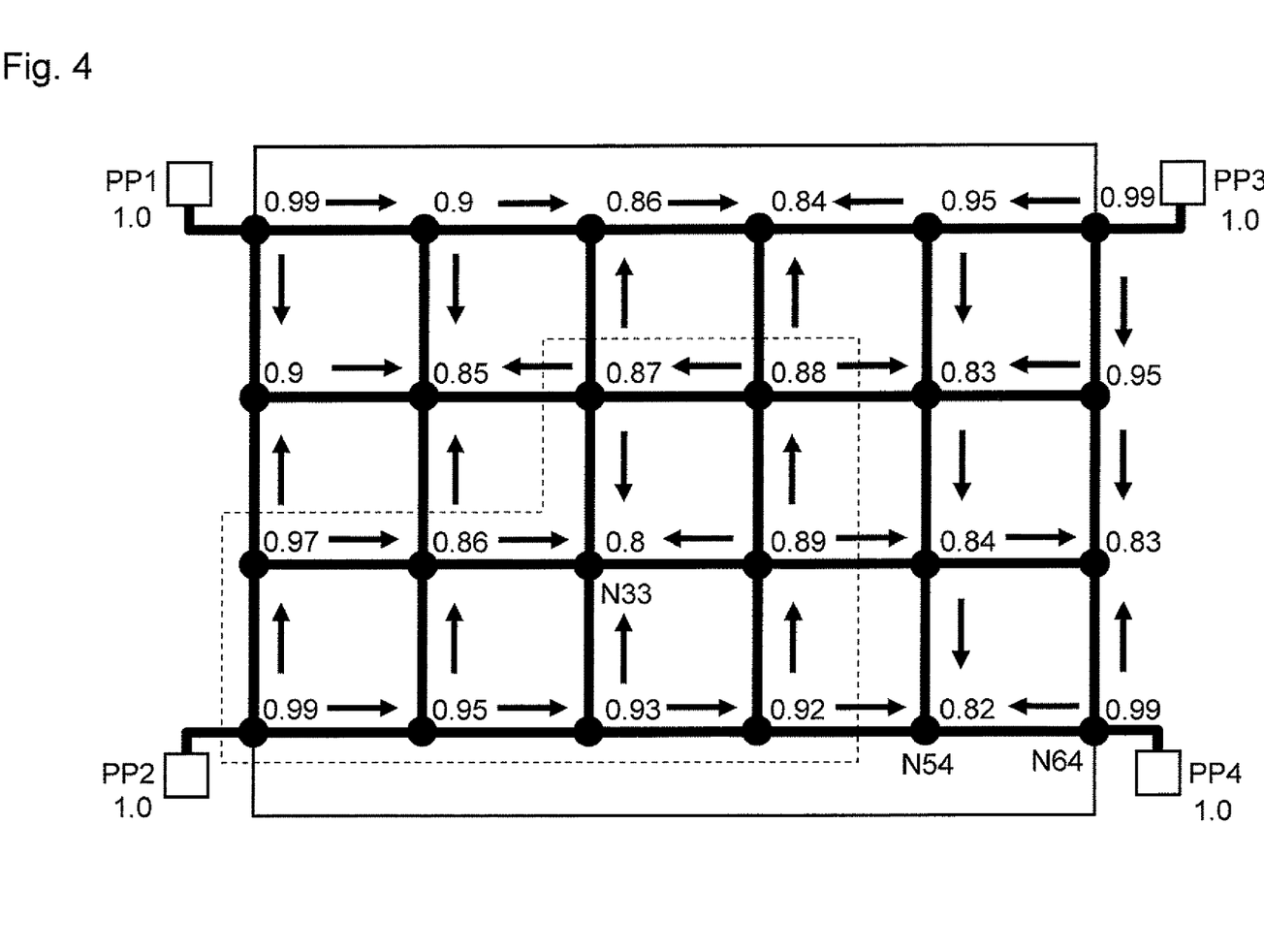
FIG. 4 is an example of voltage values at each node in the power wiring network shown in FIG. 2A obtained by a DC analysis.

FIG. 4 is an example of voltage values at each node in the power wiring network shown in FIG. 2A obtained by the DC analysis. In FIG. 4, all the voltages of the power pads PP1 to PP4 are 1.0 V. A value shown near each node indicates the voltage at the node. Arrows extending along each branch indicate directions of currents. As a matter of course, a current flows from a node having a higher voltage to a node having a lower voltage between the neighboring nodes. Note that symbols of nodes other than the nodes N33, N54, and N64 are omitted in FIG. 4.

Next, step ST4 in FIG. 1 of determining whether the IR drop violation exists or not is described. Whether the IR drop violation exists or not can be determined based on the voltage values of each node shown in FIG. 4. Here, as shown in FIG. 1, when the IR drop violation does not exist, the flow ends.

Next, step ST5 of searching a bottleneck branch and changing the resistance value of the bottleneck branch is described. As shown in FIG. 1, in step ST4, when the IR drop violation exists, a bottleneck branch is searched and the resistance value of the bottleneck branch is changed. Here, a method of searching a bottleneck branch is described with reference to FIG. 4. First, the node having a maximum IR drop, or the node having a minimum voltage, is searched. In the example of FIG. 4, the minimum voltage node is the node N33, the voltage of which is 0.8 V. In order to resolve the IR drop violation, it is necessary to raise the voltage value of the minimum voltage node N33.

Therefore, next, current paths which have an influence on the IR drop of the minimum voltage node N33 are searched. The current paths can be searched by following the arrows in the reverse direction from the minimum voltage node N33 to the power pad. In the example of FIG. 4, the region surrounded by a broken line corresponds to the current paths to be searched. Here, in the power wiring network shown in FIG. 4, the maximum value of the IR drop between the neighboring nodes is 0.17 V between the nodes N64 (voltage=0.99 V) and N54 (voltage=0.82 V). However, the branch between the node N64 and the node N54 is not included in the region surrounded by the broken line. Therefore, if the resistance value of this branch is changed, the voltage value of the minimum voltage node N33 cannot be raised effectively.

Figure 5:
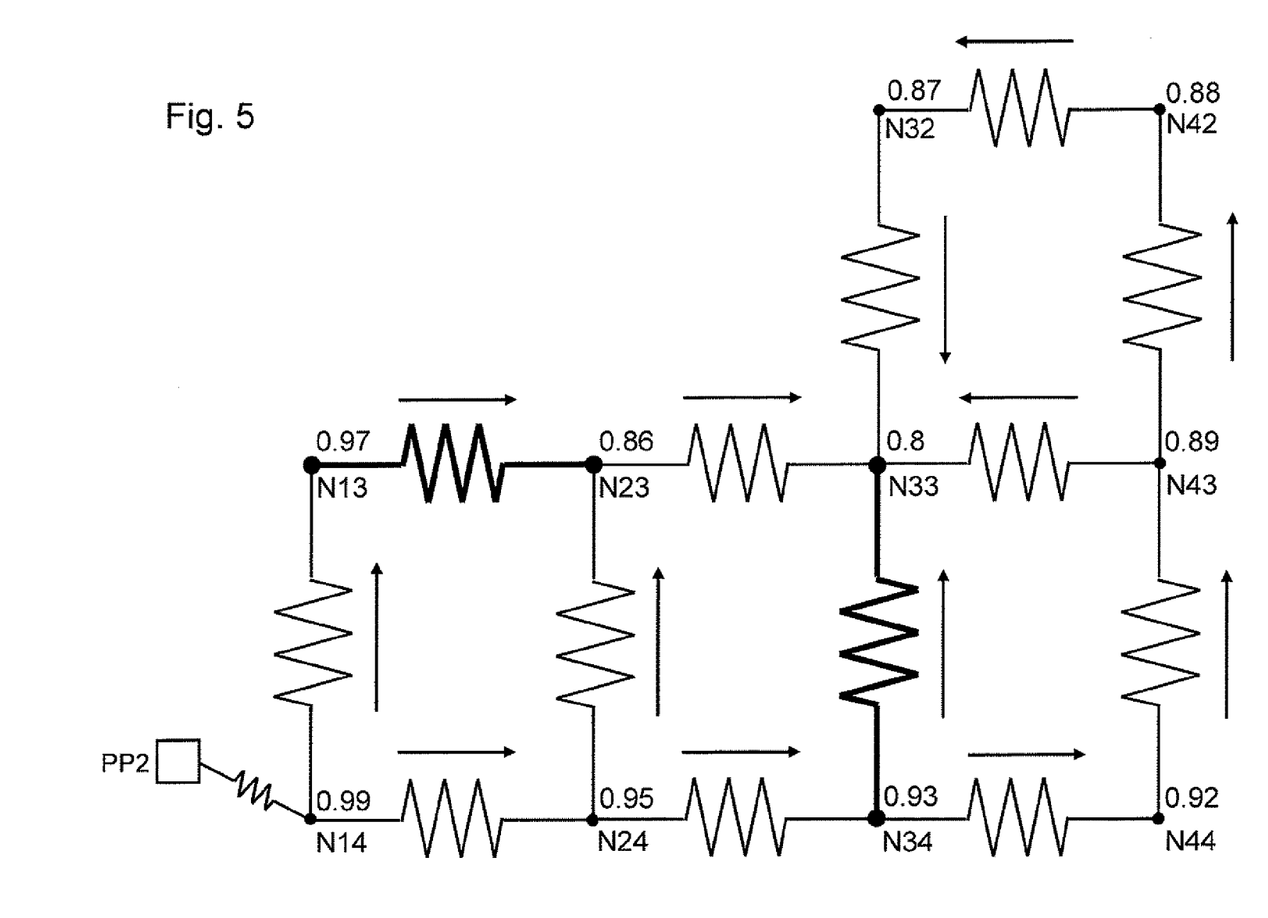
FIG. 5 is a magnified view showing a region surrounded by a broken line in FIG. 4.

FIG. 5 is a magnified view showing the region surrounded by a broken line in FIG. 4. As shown in FIG. 5, the number of current paths which lead to the minimum voltage node N33 is five. The five current paths include N33←N32←N42←N43←N44←N34←N24←N14, N33←N43←N44←N34←N24←N14, N33←N34←N24←N14, N33←N23←N24←N14, and N33←N23←N13←N14.

Here, for example, when the voltage difference between the neighboring nodes exceeds a standard value of the IR drop, the branch is assumed to be defined as a bottleneck branch. Here, for example, the standard value of the IR drop is assumed to be 0.1 V. In the case of FIG. 5, according to this definition, the branch with a voltage difference of 0.11 V between the nodes N13 and N23 and the branch with a voltage difference of 0.13 V between the nodes N33 and N34 fall into bottleneck branches. Therefore, the resistance values of these two bottleneck branches are changed. Specifically, the resistance values are decreased by widening the width of these two bottleneck branches. Here, without setting the standard value, the branch with the maximum voltage difference between the neighboring nodes (the branch between the nodes N33 and N34 in the case of FIG. 5) is assumed as a bottleneck branch, and the resistance value of the branch may be changed. In short, at least a branch with a maximum voltage difference between the neighboring nodes may be selected as a bottleneck branch and the resistance value of this branch may be changed. Then, the flow returns to step ST3 and the DC analysis is performed again. Steps ST3 to ST5 are repeated until the IR drop violation does not exist in step ST4.

Figure 6A:
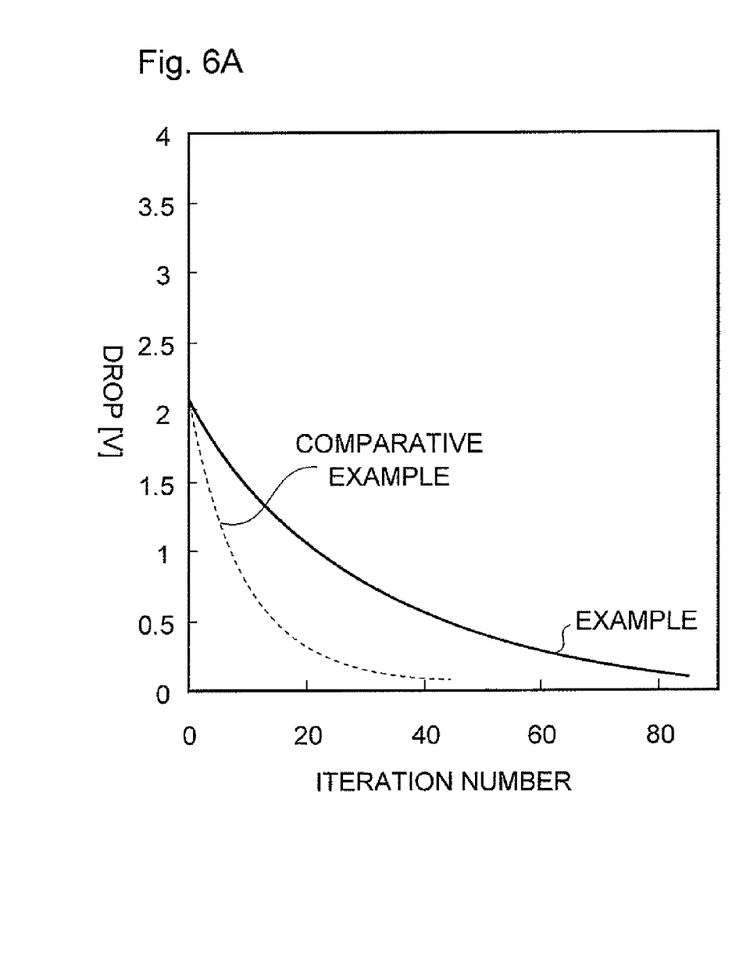
FIG. 6A is a graph showing variations in IR drop value with respect to the iteration number of the analysis.

An advantageous effect of the method for laying out a power wiring of a semiconductor device according to the first embodiment is described hereinafter with reference to FIGS. 6A and 6B. FIG. 6A is a graph showing variations in IR drop value with respect to the iteration number of the analysis. The horizontal axis of FIG. 6A represents the iteration number (number of times) of the analysis and the vertical axis represents the IR drop value (V). In an example, the method according to the first embodiment is used. On the other hand, in a comparative example, the method disclosed by Singh et al. is used. The initial IR drop value is the same because the initial resistance value is the same. As shown in FIG. 6A, assuming that the standard value of the IR drop is equal to or less than 0.1 V, the comparative example clears the standard value at the iteration number of 44. On the other hand, the example clears the standard value at the iteration number of 85. In short, the iteration number of the example is larger than that of the comparative example. However, the iteration does not require much time.

Figure 6B:
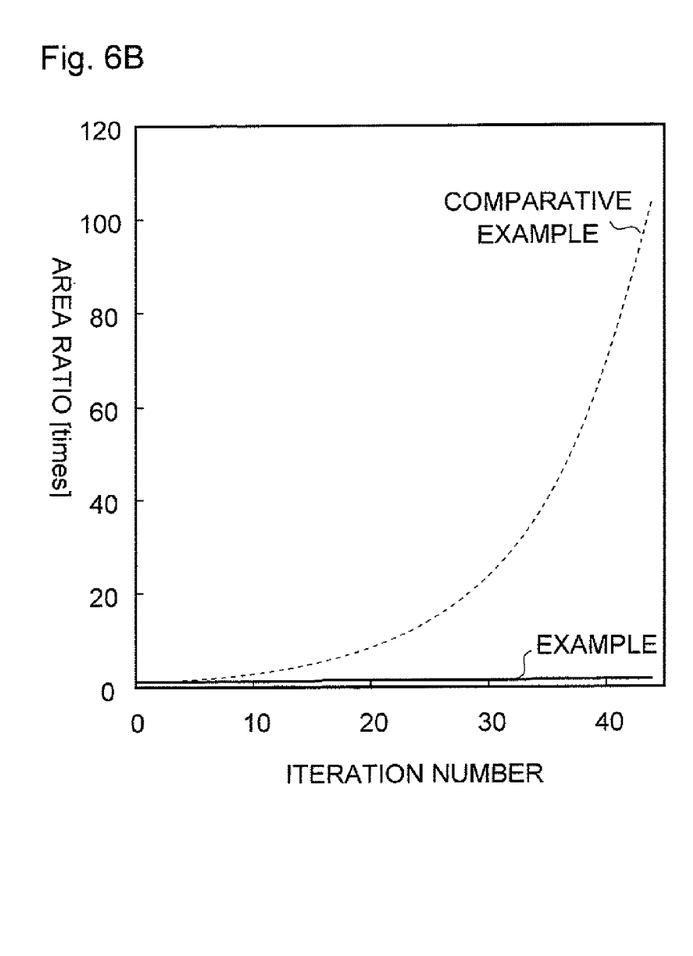
FIG. 6B is a graph showing variations in the area of the power wiring with respect to the iteration number of the analysis.

FIG. 6B is a graph showing variations in the area of the power wiring with respect to the iteration number of the analysis. The horizontal axis of FIG. 6B represents the iteration number (number of times) of the analysis and the vertical axis represents the area of the power wiring (times) when the initial area of the wiring is assumed to be 1. As shown in FIG. 6B, in the comparative example, the area of the power wiring is more than 100 times the initial area at the iteration number of 44. On the other hand, in the example, the area of the power wiring changes little compared with the initial area at the iteration number of 44. This tendency continues at the iteration number of 85 at which the example clears the standard value of the IR drop. In short, the example can reduce the area of the power wiring to about 1% of that of the comparative example while clearing the standard value of the IR drop.

Second Embodiment

Next, a method for laying out a power wiring of a semiconductor device according to a second embodiment of the present invention is described hereinafter with reference to FIG. 7. In the first embodiment, a branch with a maximum voltage difference or a voltage difference exceeding the standard value between the neighboring nodes in the region shown in FIG. 5 is selected as a bottleneck branch. In the second embodiment, the most important current path (a critical path) is determined in view of the amount of current of each branch in the region shown in FIG. 5. Further, a branch with the maximum voltage difference between the neighboring nodes included in the critical path is selected as a bottleneck branch.

Figure 7:
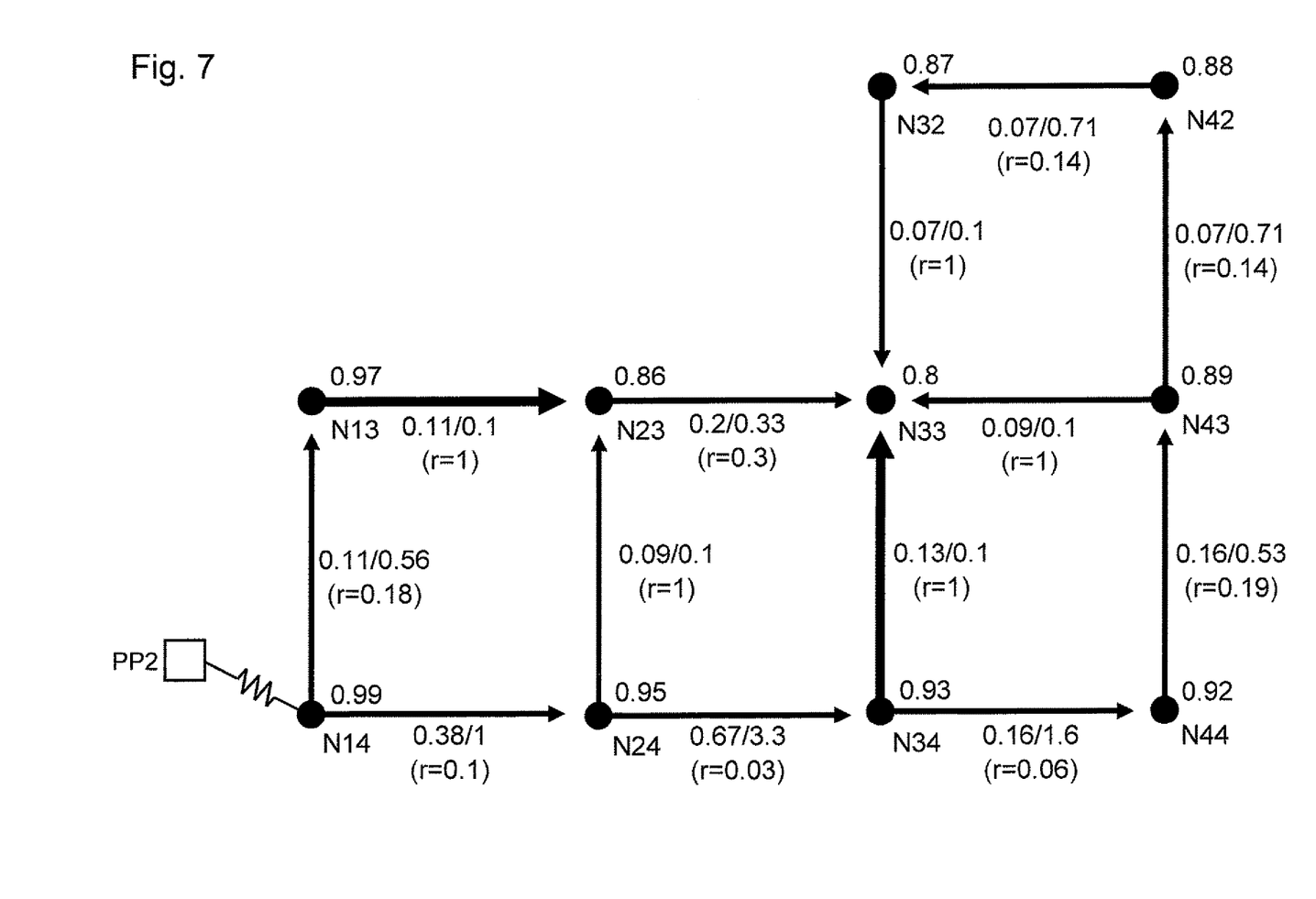
FIG. 7 is a view in which costs (=current/allowable current) are added to each branch of FIG. 5.

FIG. 7 is a diagram in which costs (=current I/allowable current Ia) are added to each branch of FIG. 5. A value r (unit: Ω) in parentheses represents the resistance value of each branch. In short, the resistance value r is the resistance value of each element resistor which is modeled. When the voltage difference between the neighboring nodes is set so as not to exceed a bottleneck standard value, an allowable current Ia can be expressed as Ia=Vbn/r by using the bottleneck standard Vbn and the resistance value r of each branch. On the other hand, the current I can be expressed as I=V/r, assuming that the voltage difference between the neighboring nodes is represented by V. Thus, cost=I/Ia=V/r/(Vbn/r)=V/Vbn.

In the example of FIG. 7, the bottleneck standard is the standard value of the IR drop. Thus, Vbn=0.1 V. For example, the allowable current Ia of the branch between the nodes N14 and N24 is expressed as Ia=0.1 V/0.1 Ω=1 A. When the voltage difference between the nodes N14 and N24 is 0.038 V (=0.99 V-0.95 V) as shown in FIG. 6, the current I is expressed as I=0.038 V/0.1 Ω=0.38 A. Therefore, cost=0.38/1. With regard to other branches, the cost is obtained in a similar manner.

As shown in FIG. 7, the number of current paths which lead to the minimum voltage node N33 is five. The five current paths include N33←N32←N42←N43←N44←N34←N24←N14, N33←N43←N44←N34←N24←N14, N33←N34←N24←N14, N33←N23←N24←N14, and N33←N23←N13←N14. Inverse numbers of costs of each current path, or inverse ratios of the current I and the allowable current Ia (=Ia/I), are added up. Then, the path with the minimum value is selected as the critical path. In the example of FIG. 7, the path (N33←N34←N24←N14) is the critical path. Further, in the path (N33←N34←N24←N14), the branch with a maximum voltage difference of 0.13 V between the nodes N33 and N34 is selected as a bottleneck branch.

Note that the starting point is the node N14 (0.99V) and the endpoint is the node N33 (0.8V) in all the above-mentioned five paths. Therefore, a sum of costs is the same value (0.99-0.8)/0.1=1.9 in all the above-mentioned five paths. Other steps are the same as those of the first embodiment, so the description thereof is omitted.

Third Embodiment

Figure 8:
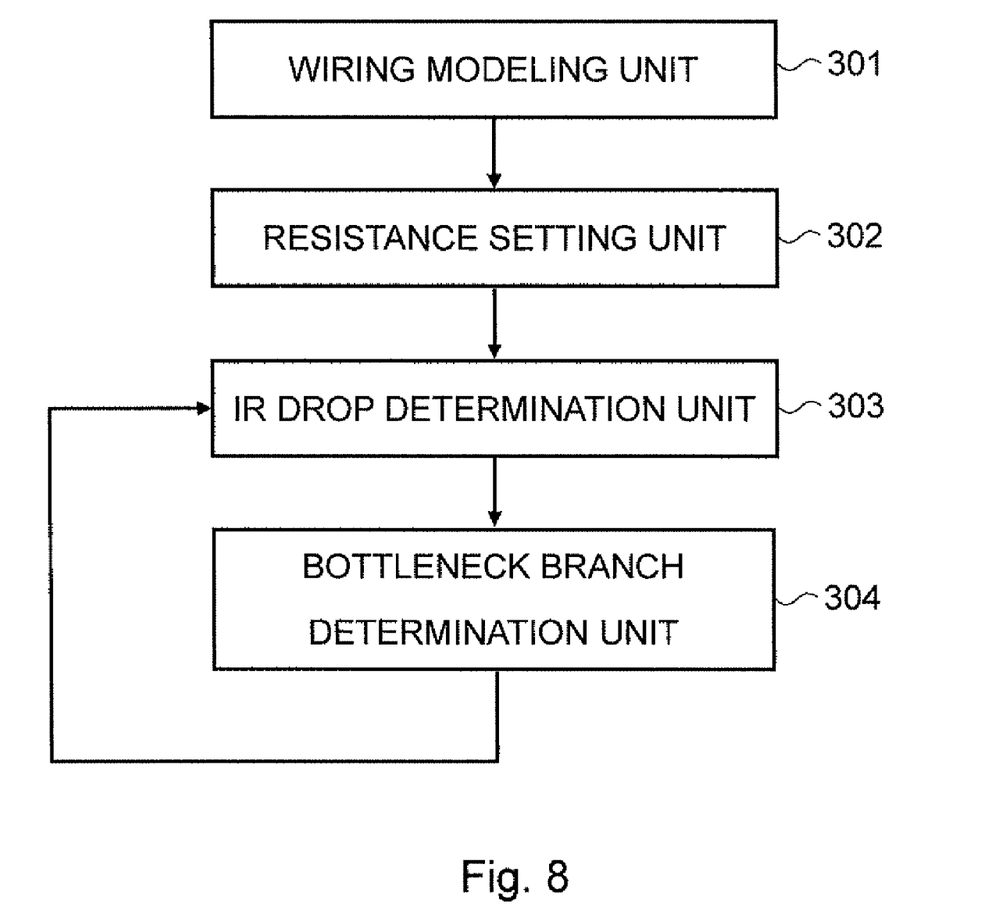
FIG. 8 is a block diagram showing an apparatus for laying out a power wiring of a semiconductor device according to a third embodiment of the present invention.

Next, an apparatus for laying out a power wiring of a semiconductor device according to a third embodiment of the present invention is described hereinafter with reference to FIG. 8. FIG. 8 is a block diagram showing the apparatus for laying out a power wiring of a semiconductor device according to the third embodiment of the present invention. The method for laying out a power wiring of a semiconductor device described above in the first and second embodiments is typically performed by being incorporated into software such as an integrated circuit design tool. However, as shown in FIG. 8, the method can also be put into practice by hardware.

As shown in FIG. 8, the apparatus for laying out a power wiring of a semiconductor device according to the third embodiment includes a wiring modeling unit 301, a resistance setting unit 302, an IR drop determination unit 303, and a bottleneck branch determination unit 304. The wiring modeling unit 301 generates a power wiring model as shown in FIG. 3 based on design data of the power wiring as shown in FIGS. 2A and 2B. The IR drop determination unit 303 determines whether the IR drop violation exists or not by using the power wiring model generated by the wiring modeling unit 301. The specific method for determining the IR drop is similar to that of the first embodiment. The bottleneck branch determination unit 304 determines a bottleneck branch having a large influence on the IR drop based on the IR drop determination result, and changes the resistance value of the bottleneck branch. The specific search method is similar to that of the first embodiment.

Although the present invention has been described with reference to the embodiments, the present invention is not limited to the above embodiments. Various modifications that can be understood by a person in the art within the scope of the present invention can be made to the configuration and details of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A method of using a processing device for laying out a power wiring of a semiconductor device, the method comprising:
   modeling the power wiring as an analysis model comprising a plurality of nodes and a plurality of element resistors provided between the plurality of nodes neighboring each other;
   obtaining voltage values of the plurality of nodes by a circuit simulation;
   searching a path of a current flowing into a node of the plurality of nodes when an IR drop violation exists in the voltage values, the node having a maximum value of the IR drop violation;
   selecting a bottleneck element resistor from among the plurality of element resistors included in the path; and
   changing a resistance value of the bottleneck element resistor,
   wherein inverse ratios of the current and an allowable current of each of the plurality of element resistors included in the path are obtained,
   the bottleneck element resistor is selected in a critical path that is a path having a minimum sum of the inverse ratios, and
   one or more of the operations of modeling the power wiring, obtaining the voltage values, searching the path of the current, selecting the bottleneck element resistor, and changing the resistance value of the bottleneck element resistor are performed using the processing device.

2. The method according to claim 1, wherein in the searching of the path, all paths of currents flowing into the node having a maximum value of the IR drop violation are searched.

3. The method according to claim 1, wherein the bottleneck element resistor comprises an element resistor having maximum voltage difference between both end nodes in the path of current.

4. The method according to claim 1, wherein the bottleneck element resistor comprises an element resistor having a maximum voltage difference between both end nodes in the critical path.

5. The method according to claim 1, wherein the circuit simulation is performed again after changing the resistance value of the bottleneck element resistor.

6. The method according to claim 1, wherein the resistance value of the bottleneck element resistor is changed from a larger value to a smaller value.

7. The method according to claim 1, wherein the resistance value of the bottleneck element resistor is changed by widening a width of the bottleneck element resistor.

8. An apparatus for laying out a power wiring of a semiconductor device, the apparatus comprising:
   a power wiring modeling unit that models the power wiring as an analysis model comprising a plurality of nodes and a plurality of element resistors provided between the plurality of nodes neighboring each other;
   an IR drop determination unit that obtains voltage values of the plurality of nodes and determines whether an IR drop violation exists or not in the voltage values; and
   a bottleneck determination unit that searches a path of a current flowing into a node having a maximum value of the IR drop violation from the plurality of nodes, determines a bottleneck element resistor from the plurality of element resistors included in the path, and changes a resistance value of the bottleneck element resistor,
   wherein inverse ratios of the current and an allowable current of each of the plurality of element resistors included in the path are obtained, and the bottleneck element resistor is selected in a critical path that is a path having a minimum sum of the inverse ratios.

* * * * *